United States Patent [19]
Markle et al.

[11] Patent Number: 6,046,796
[45] Date of Patent: Apr. 4, 2000

[54] METHODOLOGY FOR IMPROVED SEMICONDUCTOR PROCESS MONITORING USING OPTICAL EMISSION SPECTROSCOPY

[75] Inventors: Richard J. Markle; Michael J. Gatto; Chris A. Nauert, all of Austin; Yi Cheng, Dallas; Richard B. Patty, Austin, all of Tex.

[73] Assignee: Advanced Micro Devices, Inc., Sunnyvale, Calif.

[21] Appl. No.: 09/064,470

[22] Filed: Apr. 22, 1998

[51] Int. Cl.[7] .......................... G01N 21/62; G01N 31/00
[52] U.S. Cl. .............................. 356/72; 356/311; 216/60
[58] Field of Search .................................... 356/311, 316, 356/318, 72; 216/60

[56] References Cited

U.S. PATENT DOCUMENTS

| | | | |
|---|---|---|---|
| 4,491,499 | 1/1985 | Jerde et al. | 156/626 |
| 5,138,149 | 8/1992 | Cadet et al. | 250/214 |
| 5,190,614 | 3/1993 | Leach et al. | 156/626 |
| 5,208,644 | 5/1993 | Litvak et al. | 356/72 |
| 5,308,447 | 5/1994 | Lewis et al. | 156/626 |
| 5,347,460 | 9/1994 | Gifford et al. | 364/468 |
| 5,414,504 | 5/1995 | Litvak et al. | 356/72 |
| 5,546,322 | 8/1996 | Gifford et al. | 364/497 |
| 5,694,207 | 12/1997 | Hung et al. | 356/316 |
| 5,711,849 | 1/1998 | Flamm et al. | 156/643.1 |
| 5,877,032 | 3/1999 | Guinn et al. | 216/60 |

*Primary Examiner*—Frank G. Font
*Assistant Examiner*—Zandra V. Smith
*Attorney, Agent, or Firm*—Skjerven, Morrill, MacPherson, Franklin & Friel, L.L.P.; William W. Holloway

[57] ABSTRACT

In a semiconductor process which utilizes a plasma within a process tool chamber, a method of using optical emission spectroscopy (OES) to monitor a particular parameter of the process is disclosed. A first wavelength present in the plasma is determined which varies highly in intensity depending on the particular parameter by observing a statistically significant sample representing variations of the particular parameter. A second wavelength of chemical significance to the process is also determined which is relatively stable in intensity over time irrespective of variations of the particular parameter, also by observing a statistically significant sample representing variations of the particular parameter. These two wavelengths may be determined from test wafers and off-line physical measurements. Then, the intensity of the first and second wavelengths present in the plasma is measured on-line during normal processing within the process tool chamber, and the ratio between the first and second wavelength's respective intensities generates a numeric value which is correlated to the particular parameter. As an example, such a method may be used to generate a reliable alarm signal indicating the presence of etch stop conditions within a plasma oxide etcher, as well as to indicate the oxide etch rate.

12 Claims, 7 Drawing Sheets

METHODOLOGY FOR IMPROVED SEMICONDUCTOR PROCESS MONITORING USING OPTICAL EMISSION SPECTROSCOPY

BACKGROUND OF THE INVENTION

1. Field of the Invention

This invention relates to semiconductor manufacturing, and more particularly relates to the monitoring of semiconductor process operations which use a plasma within a chamber by observation of the light produced by the plasma.

2. Description of the Related Art

Optical Emission Spectroscopy (OES) is a process by which light emitted by a process, such as a plasma within a semiconductor reaction chamber, is analyzed to see which wavelengths are present in the light. Inferences about the process may then be drawn as a result of the intensity of the various spectral lines present in the light. For example, the presence of certain species within the chamber may be ascertained. OES may be used with any chamber which provides a window through which light present within the chamber may be observed. This allows use of OES even with processes having very corrosive gases present, or processes accomplished at very low or very high pressures. This non-intrusive nature is a significant advantage of OES.

Plasma light is frequently collected via a UV transparent optical fiber and brought into a spectrometer, where the light diffracts off a diffraction grating and is dispersed into its components. The dispersed light falls onto a linear photodetector array which measures the light intensity. The result of this is a measurement of light intensity as a function of wavelength (each position on the linear array corresponding to a different wavelength) which is sampled simultaneously. Other detectors used to analyze the spectral content of the emitted light may use a single optical detector (e.g., a photomultiplier tube) which is scanned over a range of frequencies (i.e., a "scanning monochrometer"). Other methods are also possible, such as a single detector used in combination with an optical bandpass filter.

OES has been used for end point detection during various etch operations. For example, during polysilicon etching to define gate electrodes, an underlying insulating layer (e.g., an oxide layer) is uncovered between gate electrodes when the overlying polysilicon is removed. OES may be used to determine when the polysilicon has been removed by looking for the first appearance of a spectral signal from the oxide layer as it is uncovered by the etch. In other cases when an entire layer is to be removed, such as removing remaining portions of a nitride layer or photoresist film, OES may be used to detect the absence of a spectral signal from the film layer being removed.

A ratio of wavelengths has previously been used with OES to monitor certain semiconductor processes, apparently based upon a chemical understanding of what wavelengths should be present for a given reaction. For example, a spectral signal that decreases as a reaction progresses (such as a spectral signal from a layer being etched through) may be ratioed against one that increases as the reaction progresses (such as a spectral signal from a layer that first appears when uncovered by the removal of the overlying layer).

Etch stop is a condition in a plasma chamber where etch rates are drastically reduced due to the deposition of a polymeric substance on the wafer. This substance "plugs" the contacts and vias and inhibits them from being fully etched. During etch stop conditions, the rate of polymer deposition exceeds the rate of polymer etch, so that, even for very long etch times, the vias are not completely etched. Current methods of determining whether etch stop conditions are present within the tool chamber may include running periodic test wafers, which are analyzed off-line using a scanning electron microscope (SEM) to determine the etching parameters resultant from the condition of the plasma chamber. Turnaround time on SEM-analyzed wafers is usually long enough to allow a significant number of product wafers to pass through a contaminated chamber, which results in lower product yields or lower throughput.

Etch stop is one of the main causes of preventative maintenance cleanings (PM's) on plasma chambers. But if done more often than necessary, valuable time is consumed in tool downtime and consequent tool unavailability. PM's are frequently performed after a set number of wafers, whether needed or not, due to the difficulty and time delay of ascertaining whether etch stop conditions are present within the tool chamber.

Lucent Technologies (Guinn, et al.) previously introduced a method of detecting etch stop by measuring the ratio of two wavelengths of importance to the chemistry inside the chamber on each of two kinds of test wafers which were run off-line, and then ratioing the two ratios to determine whether etch stop conditions were generally present within a tool chamber. The ratio of $C_2$ (515 nm) to SiF (440 nm) was computed for a blanket photoresist wafer, as well as for a patterned silicon wafer and a patterned silicon oxide wafer measured immediately preceding and under the same conditions as the blanket photoresist wafer. The range of etch rates was correlated to the photoresist removal rate which was correlated to the $C_2$ intensity. The ratio against the SiF intensity was used to correct for brightness of the plasma light. These two ratios were then ratioed together to compensate for drift of the tool over time, and the resulting "ratio-of-ratios" used to predict the etch rate of the photoresist: if too high, it indicates a resulting loss of critical dimension (CD) tolerance; and if too low, it indicates an excessive deposition of photoresist and other polymeric material that is unstrippable, namely etch stop conditions within the chamber. Such measurements were not performed on actual production wafers but required use of special test wafers run at periodic intervals.

One of the difficulties of using OES in a semiconductor process is the large number of spectral lines present within many typical plasmas, which may contain a large number of different reaction components. Each molecule within a plasma emits its own spectral signature, which may overlap the spectral signature of other molecules present within the plasma. Each species has its own fingerprint of wavelengths. Identifying the individual species is difficult, however, because the fingerprints overlap each other, and may share particular wavelengths. Attempting to analyze such data without a methodical analysis is time consuming and likely to result in less than optimal process monitoring. Moreover, utilizing expected spectral wavelengths based solely upon the chemistry of the reaction may result in false indications of process conditions such as etch stop. This may result when a spectral line is cluttered by neighboring lines from other species.

What is needed is an on-line method for monitoring a process using OES which minimizes or doesn't require use of off-line test wafers periodically processed between production runs. Moreover, what is additionally needed is a faster, more systematic selection of process-important data from a broad array of collected data, and a method which reduces the risk of selecting unreliable fault detection and monitoring signals. When applied to etch stop detection, such a capability would allow less frequent PM's and a consequently longer chamber life, because chamber cleans would be performed only when needed. Moreover, product yields could increase because fewer wafers would be processed when etch stop conditions are present and before such conditions are discovered.

SUMMARY OF THE INVENTION

The present invention provides a methodology for determining which spectral peaks are of interest for a given process, how they change over time, and how they can be identified when the spectral data is cluttered with so many other spectral lines. It allows measurements to be taken on production wafers without requirement of on-going measurement of any test wafers off-line.

In one embodiment suitable for use in a semiconductor process which utilizes a plasma within a process tool chamber, the invention affords a method of using optical emission spectroscopy (OES) to monitor a particular parameter of the process which includes first determining a first wavelength present in the plasma which varies highly in intensity depending on the particular parameter, and also determining a second wavelength of chemical significance to the process which is relatively stable in intensity over time irrespective of variations of the particular parameter, determining both wavelengths by observing a statistically significant sample representing variations of the particular parameter. Then, measuring the intensity of the first and second wavelengths present in the plasma on-line during normal processing within the process tool chamber, and ratioing the first and second wavelength's respective intensities to generate a numeric value which is correlated to the particular parameter.

In certain embodiments, the invention may be used during a plasma-assisted etching process (e.g., an oxide etching process), or a plasma-enhanced deposition process. The numeric value correlated to the particular parameter may be used to generate an alarm signal for indicating when the particular parameter is out of specification such as, for example, whether etch stop conditions are present within the chamber. Such an alarm signal may be generated by comparing the numeric value to a predetermined threshold value to indicate when the particular parameter is out of specification. The numeric value correlated to the particular parameter may also be used to determine a physical value of the particular parameter within a range of values, which may then be used to control the process within the chamber.

In other embodiments of the invention, the first wavelength may be chosen which also varies highly in intensity depending on a second parameter, and the second wavelength may be chosen which is also relatively stable in intensity over time irrespective of variations of the second parameter, both by observing a statistically significant sample representing variations of the second parameter, and the numeric value is also correlated to the second parameter. The invention embodiment may include comparing the numeric value to a predetermined threshold value to generate an alarm signal for indicating when the particular parameter is out of specification, and using the numeric value to determine a physical value of the second parameter and to monitor variations of the second parameter. The second parameter may comprise an etch rate within the chamber.

In still other embodiments of the invention, the first wavelength and the second wavelength may be determined by processing a statistically significant sample of wafers representing variations of the particular parameter and measuring OES data for each wafer, periodically performing physical measurements of the particular parameter, and statistically correlating the OES data with the physical measurements to determine both the first wavelength present in the plasma which varies highly in intensity depending on the particular parameter, and the second wavelength of chemical significance to the process which is relatively stable in intensity over time irrespective of variations of the particular parameter.

By utilizing the method of the present invention, certain improvements and advantages are apparent: increased time between necessary chamber cleans, decreased cost of consumables, reduced cost and time of off-line processing and SEM analysis, and others. The invention also serves to prevent product jeopardy (thus increasing product yields), decrease PM recovery time, and decrease line cycle time by reducing non-process time for plasma cleans, and may also be used to optimize chamber seasoning, minimize previous wafer effects, and optimize post-etch cleans.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DESCRIPTION OF THE PREFERRED EMBODIMENT(S)

An Applied Materials 5300 HDP Etcher was used to study the correlation of OES data to the determination of etch stop conditions during a contact/via etch performed through an inter-metallic dielectric layer, such as an oxide. An SC Technology OES Monitor was attached to the viewing port of the plasma etcher and which transmits light to a photodiode array via a fiber optic cable. A diffraction grating of 150 grooves/mm was used to provide spectral intensity sampling of approximately 500 individual wavelengths within the range of 200 to 900 nm.

Figure 1:
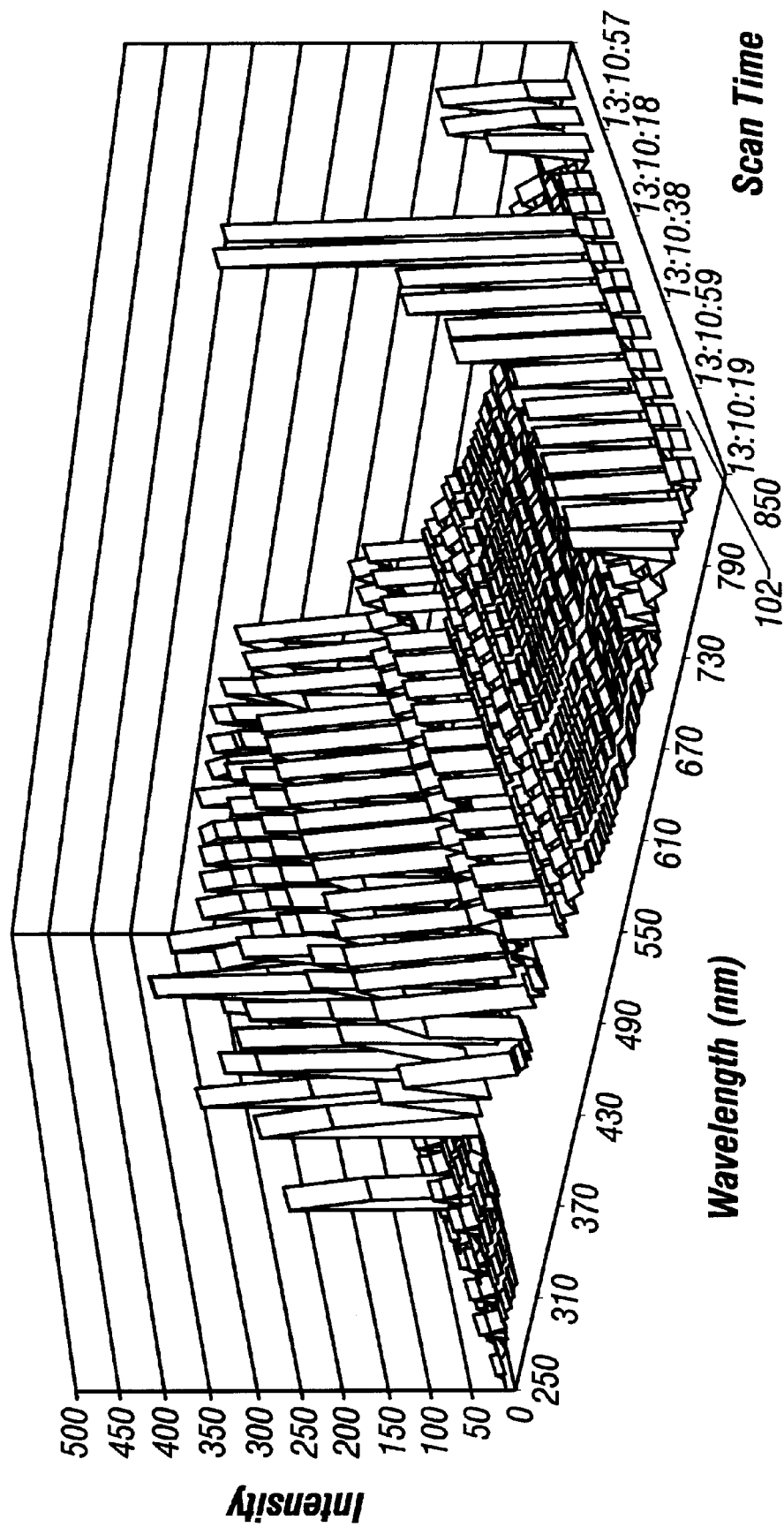
FIG. 1 is a three-dimensional chart depicting the spectral content of a plasma during an oxide etch of a representative wafer, and shows the variations in spectral intensity for each of several scans taken throughout the duration of the etching time.

FIG. 1 illustrates the observed spectral intensities at various times during a particular oxide etch, as measured on a photoresist-covered dummy wafer. The observed wavelengths range from approximately 250 to 850 nanometers (as plotted along the x-axis). The intensity of the wavelengths are shown on the y-axis, and the time elapsed during the etch shown on the z-axis. Sixteen (16) scans are shown, each taken at approximately 10 second intervals. For example, scan line 102 is the third scan taken during the etch sequence, and shows the spectral intensity for each sampled wavelength between approximately 250 to 850 nanometers. Assuming 16 scans per wafer, 512 different wavelengths sampled, and 24 wafers in a lot, each lot scanned may generate over 196,000 spectral data points.

A "marathon" of wafers is the number of wafers which may be processed in an etcher before the chamber requires cleaning (e.g., to prevent etch stop). A marathon of approximately 2500 photoresist-covered ("PR dummy") wafers was processed through the Applied Materials 5300 HDP etcher, starting initially with a clean chamber. (These PR dummy wafers may be recycled and processed repeatedly to lower the cost of such an experiment.) OES data was obtained similar to that shown in FIG. 1 and archived in a database. At certain intervals, (e.g., every 100 PR dummy wafers processed through the machine), one or more characterization (or monitor) wafers were processed. One of the characterization wafers mimics the actual via etch process, and uses an oxide film with a patterned PR layer to afford oxide etching (like a via etch). Such characterization wafers may also include patterned poly, patterned oxide, and non-patterned particle test wafers. Physical measurements are then taken on these characterization wafers, such as by destructive analysis (e.g., SEM analysis) to measure some physical parameter (e.g., etch depth, etch rate, via size (for etch uniformity), nitride etch rate and uniformity, corner selectivity, etch depth capability, particle count data, etc.), which are then correlated to the OES data. Thus the data becomes paired data, which makes for stronger correlation. At the end of the wafer marathon, etch stop is intentionally induced by omitting the post-etch treatment (PET) step. The PET step is an oxygen-rich plasma which basically ashes the buildup of polymeric material within the chamber, and which also strips the remaining resist off the wafer. The OES spectral measurements are likewise taken on a group of wafers (e.g., five wafers) etched when such induced etch stop conditions are present within the chamber.

After all this data is collected, methodical statistical analysis is performed to determine a list of potentially important signals to observe, which are statistically good signals. This is done by finding the wavelengths that have the highest variation over time; then correlating them to measurements of interest (lack of etch stop conditions, etch rate, etc.) using, for example, partial least squares analysis (LSA), and principle component analysis. This procedure affords finding the wavelengths that have the strongest correlation to wafer measurements of interest, and that accurately track parameters of interest over the wafer marathon. Of the several wavelengths found to be highly correlated to the measured data collected throughout the marathon, several are chosen that correspond to the chemistry being monitored (rather than any spectral line whose presence is not particularly related to the chemistry in question). Database software such as RS1™ and SAS™ may be used for analyzing the OES and physical parameter measurement data. EXCEL™ may also be used advantageously. Software tools such as MATLAB™ may be used advantageously for analyzing which wavelengths vary the most.

OES data unfortunately varies over time for any given process due to, for example, the viewing port becoming coated with polymers and other reaction products, power fluctuations in the chamber, variations in gas flow rates, and other causes. Measuring the intensity of just a single wavelength or even a couple of wavelengths would most likely result in false predictions or measurements. So the wavelength of interest (i.e., a statistically good signal having a high observed variation and high correlation to a particular process parameter) is ratioed against a reference wavelength, chosen as one that corresponds to the reaction chemistry within the chamber (it must be a "believable" signal), but which is relatively stable in intensity over variations in the particular parameter. In other words, the reference wavelength should have a strong enough signal to be above the spectral noise level, and should vary enough to provide the normalizing effect, but it should have a relatively small amount of variation compared to the wavelength of interest.

In other words, the most variable wavelengths of interest, that indicate something about the process, is ratioed against an internal standard wavelength to compensate for natural variations in intensity. Such a ratio is preferably calculated using typical spectra (mean) during the marathon, using a control spectra (+3 sigma data from normal etching during the marathon), and using induced etch stop data taken at the conclusion of the marathon. In such a fashion, the key wavelengths and normalized ratios that correlate to etch stop could be readily identified and the normal variation suppressed. Such a technique allows systematically selecting optimum wavelengths for stable, reliable, and strong fault detection signals.

Figure 2:
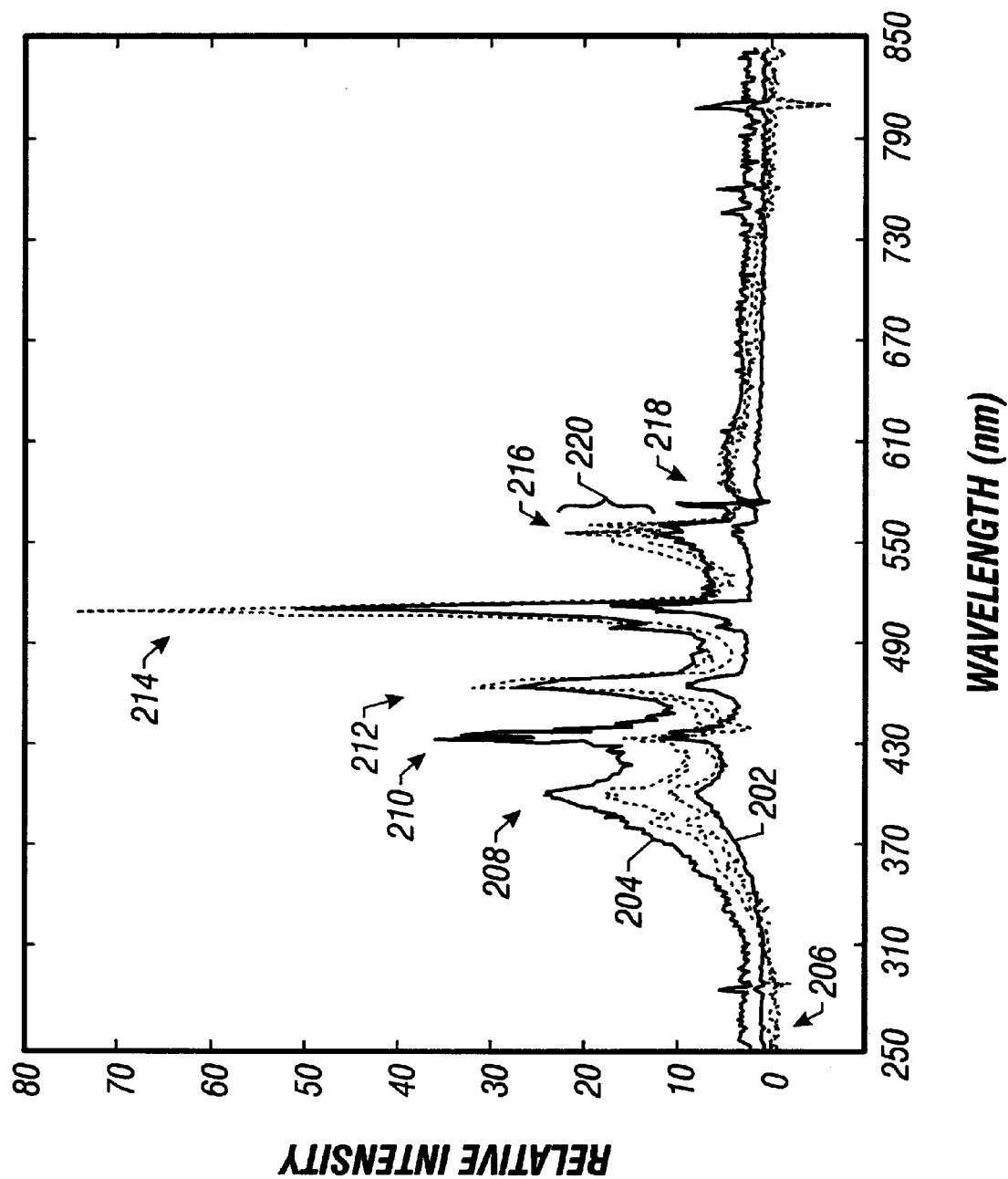
FIG. 2 is a two-dimensional chart depicting the spectral content of a plasma at a given time during an oxide etch, and shows a comparison of qualification wafers to induced etch stop wafers.

FIG. 2 is a two-dimensional chart depicting the spectral content of a plasma for an oxide etch, taken during the middle portion of the main etch for a variety of conditions described below. The spectral intensity is plotted on the vertical axis for each sampled wavelength, which is indicated on the horizontal axis. Waveform 202 represents the spectral intensity for a group of 18 qualification wafers and corresponds to one standard deviation above the mean (the mean plus one sigma). Waveform 204 represents the spectral intensity for the same group of qualification wafers and corresponds to three standard deviations above the mean (the mean plus three sigma). Waveforms 206 (plotted as dashed lines) represent the spectral intensity measured on each of four wafers which were processed to intentionally induce etch stop (the "induced etch stop" (IES) wafers).

Several spectral intensity peaks are easily discerned in FIG. 2. Peak 208 (corresponding to a wavelength of 408.4 nm) shows a noticeable increase in spectral intensity, and also shows the data from the four induced etch stop wafers falling between the one and three sigma points of the qualification wafer data. Peak 210 (corresponding to a wavelength of 440.8 nm) shows a somewhat similar result. Peak 212 (corresponding to a wavelength of 472 nm) and peak 214 (corresponding to a wavelength of 520 nm) show the data from the four IES wafers falling near or beyond the three sigma data from the qualification wafers. Interestingly, the waveform peak 216 (corresponding to a wavelength of 562 nm) shows the data from all four IES wafers falling significantly beyond the three sigma data from the qualification wafers as indicated by portion 220. Also of interesting note, the peak 218 (corresponding to a wavelength of 581.2 nm) shows the data from the four induced etch stop wafers falling substantially between the one and three sigma points of the qualification wafer data (similar to peak 208), but in this case also shows a fairly small change in spectral intensity (a fairly small spectral peak), which is unlike peak 208.

Figure 3:
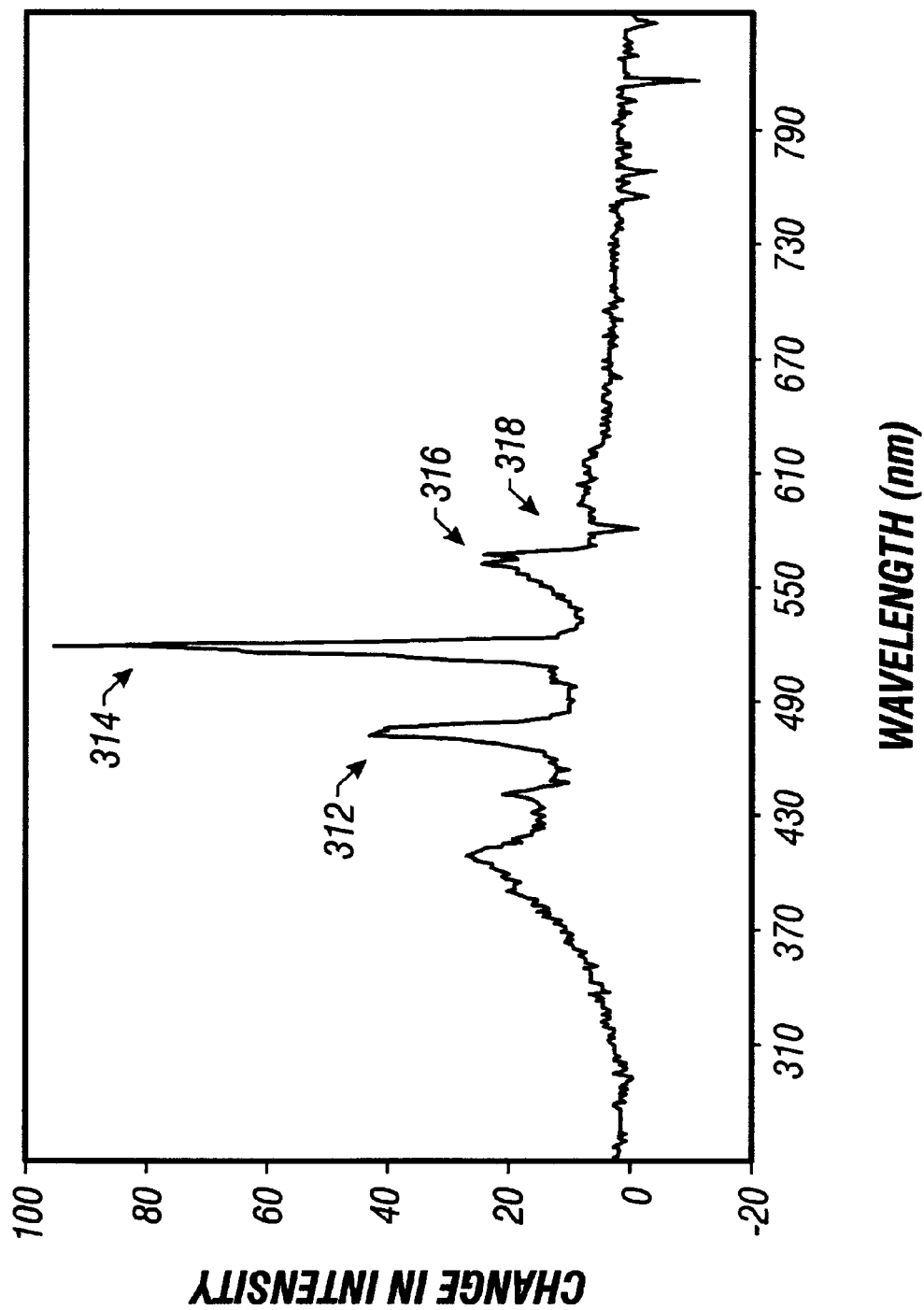
FIG. 3 is a two-dimensional chart depicting the difference in spectral content between two sequential wafers, one substantially free of etch stop and the other exhibiting etch stop, measuring the plasma at a given time during an oxide etch.

Referring now to FIG. 3, the change in (e.g., "delta") spectral intensity data between two sequential wafers is shown, sampling the plasma at a given time during an oxide etch, where the earlier wafer is processed substantially free of etch stop conditions, and the later wafer is processed with induced etch stop conditions. The delta intensity peak 314 shows what a sudden and significant change in spectral intensity occurs (at a wavelength of 520 nm) for the very first wafer exhibiting etch stop conditions. Significant other peaks occurs at additional wavelengths, including delta intensity peak 312 (at 472 nm) and delta intensity peak 316 (at 562 nm). The small height of the delta peak 318 demonstrates the rather constant intensity of the spectral line corresponding to a wavelength of 581.2 nm irrespective of whether etch stop conditions are present. Such a wavelength may be a good candidate for a reference wavelength if its presence has chemical significance to the particular process.

Figure 4:
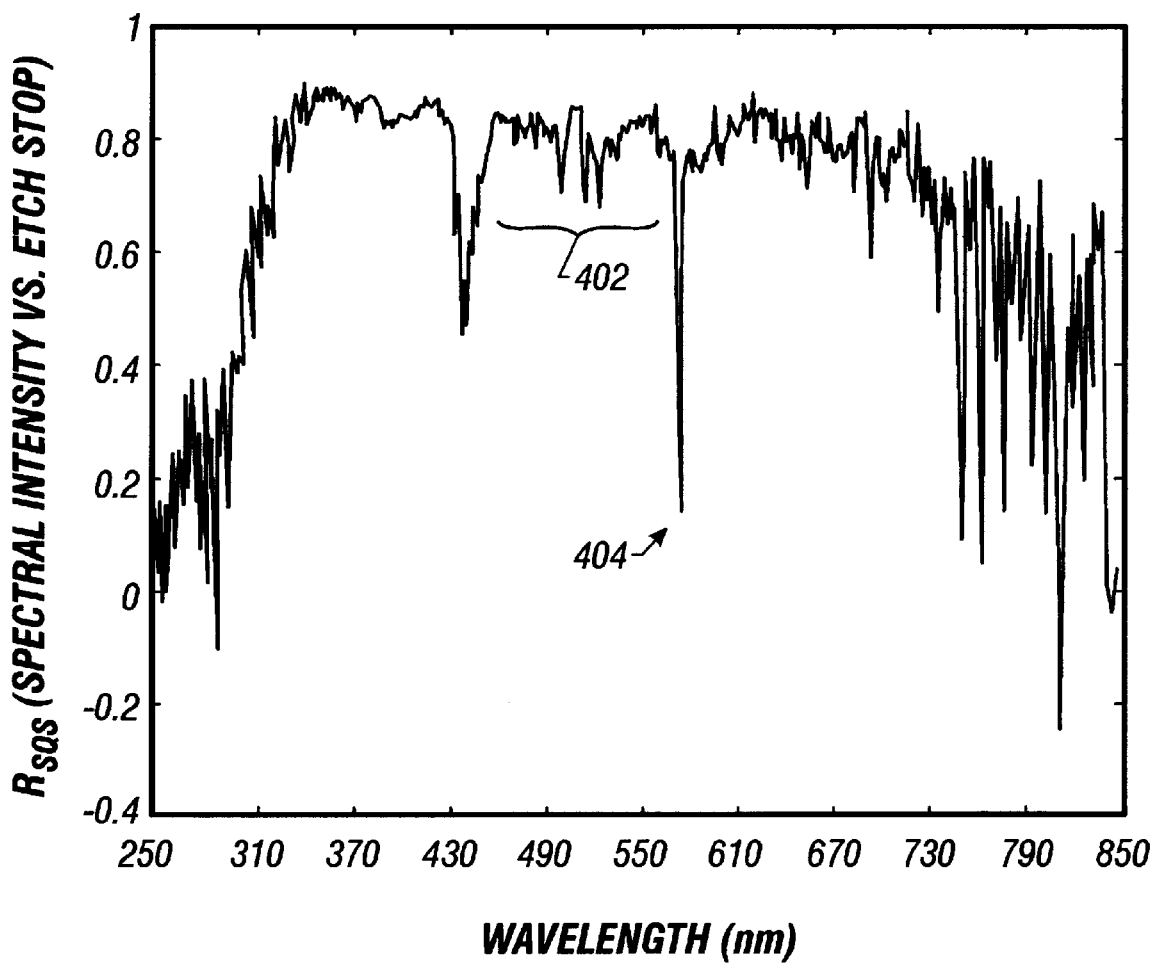
FIG. 4 is a two-dimensional plot of a correlation coefficient (Rsqs) for each wavelength's intensity to a measured etch parameter which is indicative of etch stop, and which figure indicates a high degree of correlation between many of the wavelength peaks indicated in FIG. 2 and etch stop, and which figure also indicates a fairly stable wavelength (having low correlation) irrespective of etch stop conditions.

FIG. 4 is a two-dimensional plot of a correlation coefficient (Rsqs) computed from a least squares analysis for each wavelength's measured intensity (from the third scan line) when correlated to a measured parameter which indicates the amount of etch stop. The measured parameter is "Center (of wafer) Aspect Ratio Dependent Etching," (i.e., "Center_ARDE"), and is measured using a scanning electron microscope to measure the size and depth of the vias formed during the via etching process. Such a measurement is indicative of the degree of etch stop conditions which are present during via etching. As can be seen by Rsqs values of near 0.8, particularly within the region 402, the measured spectral intensity of many of the wavelength peaks indicated in FIG. 2 correlate highly with the measured degree of etch stop conditions.

FIG. 4 also indicates a fairly stable wavelength (having low correlation) irrespective of etch stop conditions at data point 404 (which corresponds to 581.2 nm). Such a spectral intensity may be used to compensate for variations in observed spectral intensities due to clouding of the chamber viewing port, power fluctuations, etc., by taking a spectral intensity of a wavelength which varies highly with etch stop, and dividing by the spectral intensity of this wavelength which is fairly insensitive to etch stop. This stable wavelength of 581.2 nm represents $CF_2$, which is significant to this particular etch process chemistry. Further experimentation using a high resolution scan may reveal other species, such as $N_2$ or others, that may also be present in the plasma and represented by this wavelength.

Figure 5:
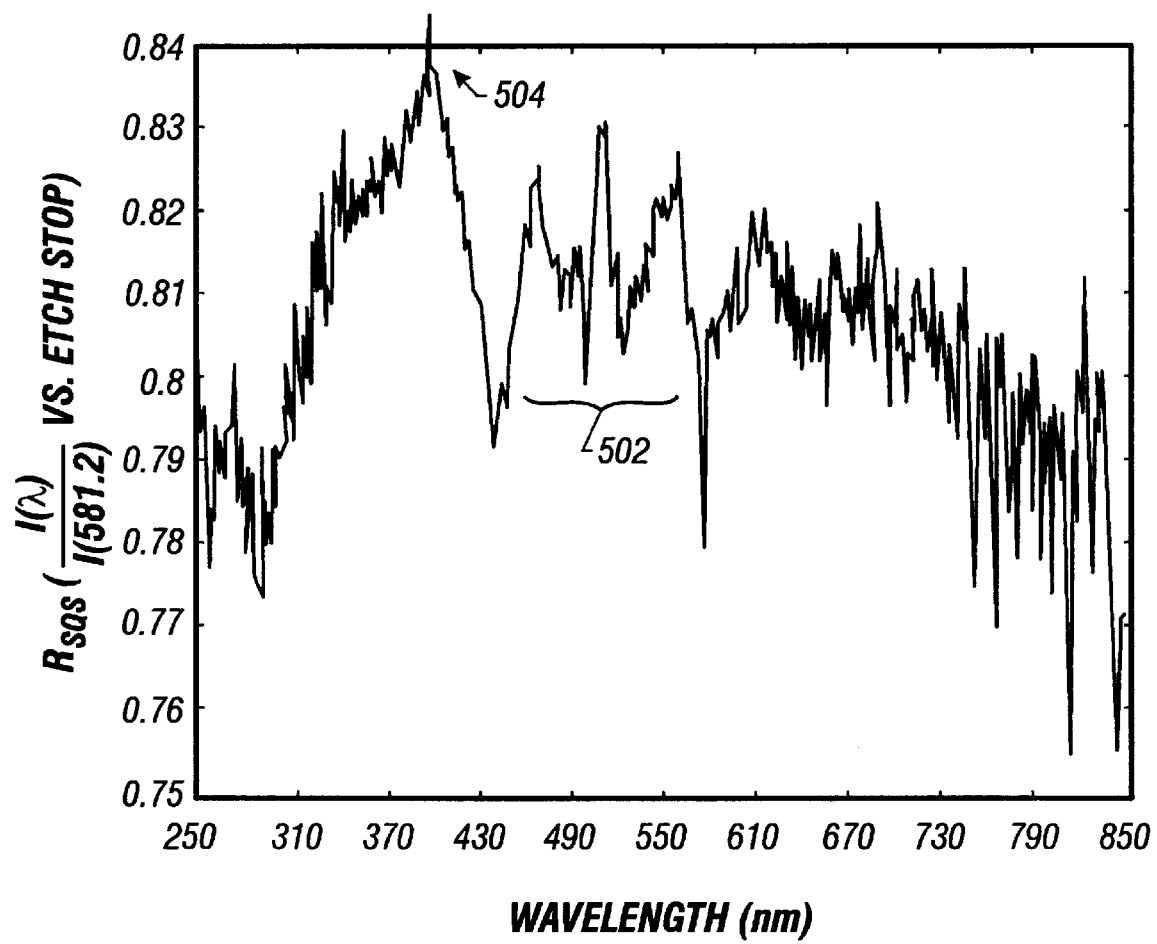
FIG. 5 is a two-dimensional plot of a correlation coefficient (Rsqs) for the ratio of each wavelength's intensity to the stable wavelength's intensity, and which indicates a high degree of correlation to a measured etch parameter which is indicative of etch stop.

FIG. 5 shows a two-dimensional plot of the correlation coefficient (Rsqs) for the ratio of each wavelength's spectral intensity to the "stable" (581.2 nm) wavelength's intensity when correlated to the measured Center_ARDE. Very good correlation is indicated for many of the wavelengths of interest, including the various peaks indicated in FIG. 2 which are within the indicated region 502, and which each have a correlation coefficient of at least approximately 0.8. The greatest correlation (data point 504) was determined for this particular set of process conditions to correspond to the measured spectral intensity at 408.4 nm. While the greatest correlation of this spectral intensity ratio of two wavelengths against measured Center_ARDE (indicative of etch stop) was achieved using spectral data from the middle portion of the main etch step, all of the scan lines showed similar correlation.

Figure 6:
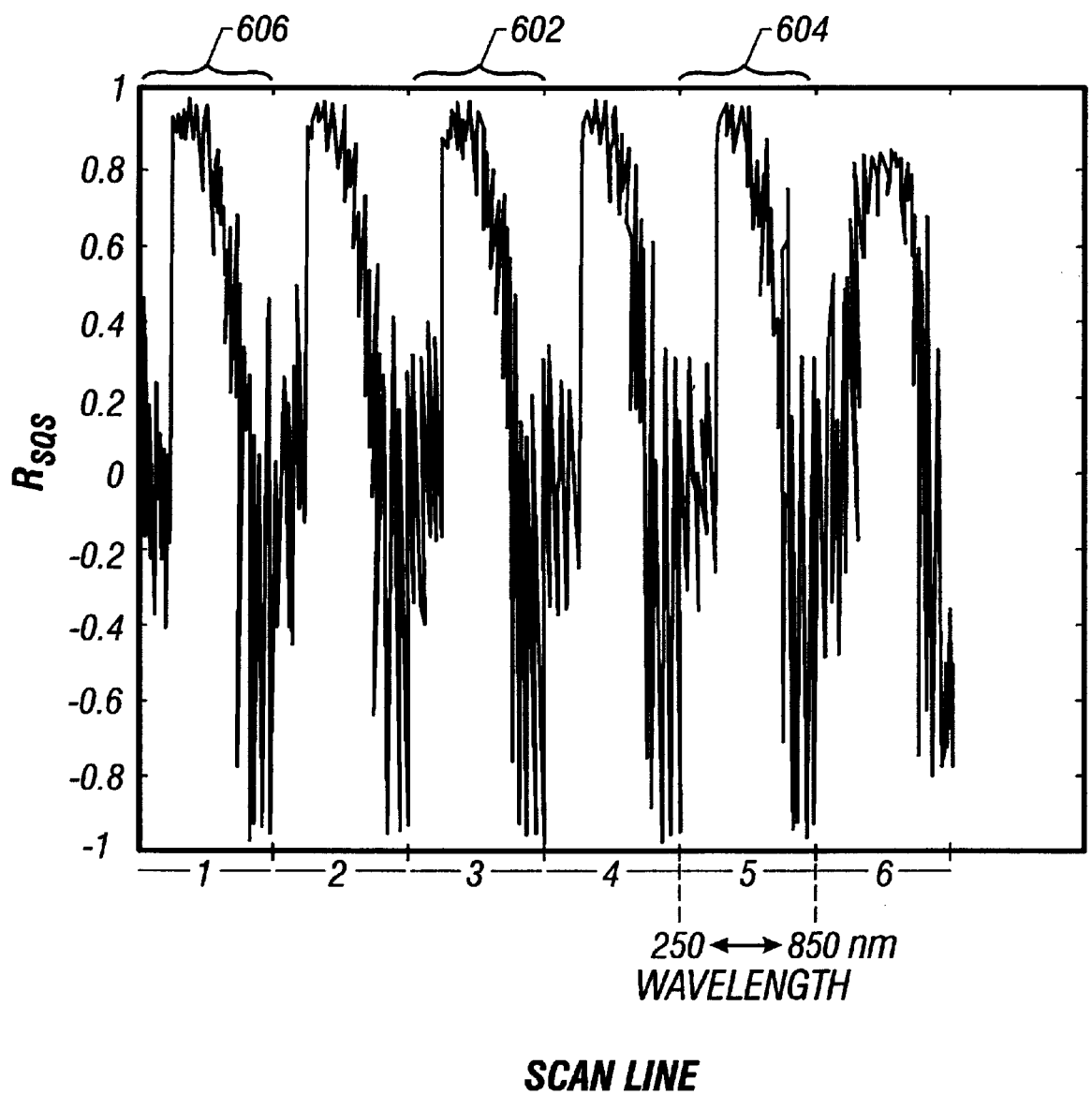
FIG. 6 is a two-dimensional plot showing the computed correlation coefficient for each of six scan lines of measured spectral data from a local interconnect (LI) etch operation marathon.

FIG. 6 shows the computed correlation coefficient for each of six scan lines of measured spectral data from a local interconnect (LI) etch operation marathon. Region 602 represents the computed results arising from the third scan line, while region 604 represents the computed results arising from the fifth scan line. As shown on the horizontal axis within region 604, each region represents wavelengths from 250 through 850 nm, as in earlier figures. Correlation data from the local interconnect marathon indicated the greatest correlation using data from the first scan (depicted as region 606). As can be seen in FIG. 6, each scan produced a similar correlation result. The particular correlation values differ slightly from the earlier figures due to the different chemistry of the LI etch compared to the via etch.

Figure 7:
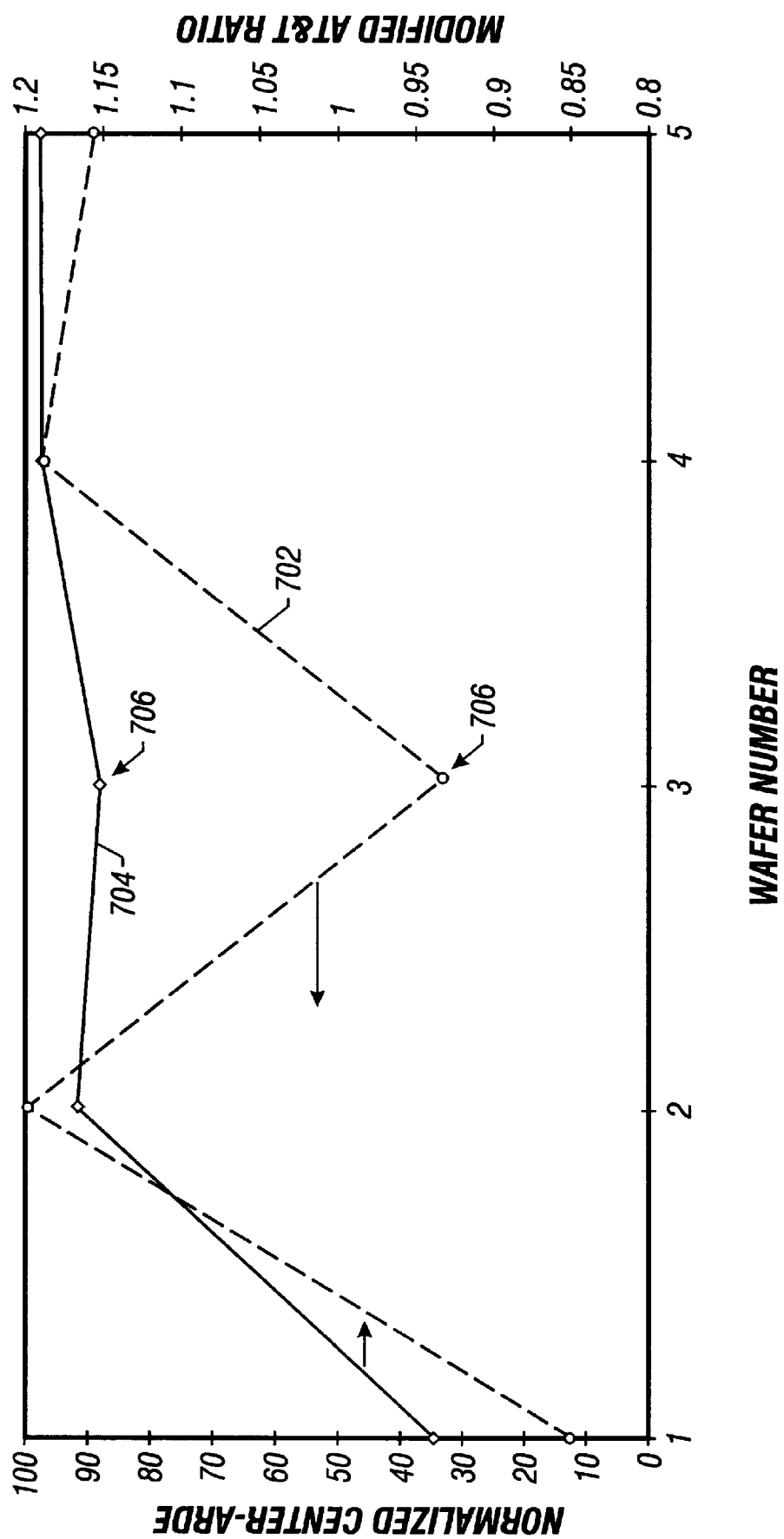
FIG. 7 is a two-dimensional plot showing a measured etch parameter, NORM_ARDE, which is indicative of etch stop, and a modified prior art ratio technique, which figure shows a lack of correlation between the modified prior art ratio technique and etch stop.

FIG. 7 is a two-dimensional plot showing, for each of five sequentially processed wafers, a measured and normalized etch parameter, NORM_ARDE, which is indicative of etch stop, and a calculation of a modified prior art (AT&T) ratio technique. Waveform 702 depicts the measured etch parameter, NORM_ARDE, indicated on the left-hand vertical axis (higher numbers indicating increased etch stop), and waveform 704 depicts the modified AT&T ratio technique prediction, as indicated on the right-hand vertical axis. Etch stop was induced after processing the first wafer by eliminating the PET step, which causes immediate and significant etch stop on the very next wafer (e.g., wafer 2). As can be seen at data point 706, the modified prior art method (taking the ratio of the 516 nm (C2) intensity over the 440 nm (SiF) intensity measured early in the etch sequence) mis-predicts etch stop for wafer number three while the measured data at data point 708 indicates otherwise. This FIG. 7 shows a lack of correlation between the modified prior art ratio technique and etch stop, and highlights the improved correlation achievable by using the methods of the present invention.

In accordance with the present invention, after choosing the wavelengths of interest and the reference wavelength, the ratio having the highest correlation to the particular parameter is determined. Thereafter, the OES measurements may be performed on-line, without using test wafers off-line to calibrate the actual product wafer measurements. This is an additional advantage of the present invention.

This technique also provides a statistically rigorous method for determining improved monitoring conditions during plasma processing. In many of the prior art techniques, wavelengths are selected apparently based upon a knowledge of the chemistry involved, not based upon statistical analysis. Even though a particular spectral line is known to be present in the plasma, and indeed it is measured and it affords some usefulness, does not mean it is statistically the best one to use. Moreover, many such prior art techniques must be performed off-line, and the data analyzed before the tool performance may be inferred.

The contact/via marathon resulted in four wavelengths useful for predicting etch stop. These four wavelengths of interest (406, 412, 472, and 520 nm), when ratioed to a reference wavelength (581.2 nm, $CF_2$), each showed strong correlation (no Rsqs<0.57) to oxide etch rate (both average and standard deviation), poly etch rate (both average and standard deviation), and selectivity, as well as between OES data and etch stop as measured by SEM.

As an additional example, a local interconnect (LI) marathon was performed to determine wavelengths useful for predicting etch stop. For this different etch chemistry involved, the two selected wavelengths (440.8 nm and 517.6 nm), when ratioed to a reference wavelength, each showed strong correlation between OES data and etch stop as measured by SEM. Both are ratioed to a stable wavelength (581.2 nm, $CF_2$) that has a low standard deviation throughout the marathon to account for wafer to wafer variations in intensity.

The methodology of the present invention may also be used to select wavelengths which simultaneously provide etch stop detection and oxide etch rate tracking, even though the selected wavelengths may not provide the strongest correlation to either etch stop detection or to etch rate monitoring. The etch stop detection is a catastrophic product-jeopardy detector: if it ever indicates etch stop, one should stop and clean the chamber before running any more wafers. But the same wavelengths can also be used to monitor etch rate, and which potentially would allow for compensation of observed etch rate by adjusting power levels, gas blends, etc., to more tightly control the etch. This affords additional process control monitoring capability to the plasma etch operation.

This invention, in its many embodiments, is well suited to monitoring the manufacture of integrated circuits when using a plasma within a chamber, such as certain plasma-assisted etching systems and certain deposition (e.g., plasma-enhanced chemical vapor deposition (PECVD) systems). In one such embodiment, the invention affords a method of using optical emission spectroscopy (OES) to monitor a particular parameter of the process, which method includes first determining a first wavelength present in the plasma which varies highly in intensity depending on the particular parameter, and also determining a second wavelength of chemical significance to the process which is relatively stable in intensity over time irrespective of variations of the particular parameter, determining both wavelengths by observing a statistically significant sample representing variations of the particular parameter. Then, measuring the intensity of the first and second wavelengths present in the plasma on-line during normal processing within the process tool chamber, and ratioing the first and second wavelength's respective intensities to generate a numeric value which is correlated to the particular parameter.

In certain embodiments, the invention may be used during a plasma-assisted etching process (e.g., an oxide etching process), or a plasma-enhanced deposition process. The numeric value correlated to the particular parameter may be used to generate an alarm signal for indicating when the particular parameter is out of specification such as, for example, whether etch stop conditions are present within the chamber. Such an alarm signal may be generated by comparing the numeric value to a predetermined threshold value to indicate when the particular parameter is out of specification. The numeric value correlated to the particular parameter may also be used to determine a physical value of the particular parameter within a range of values, which may then be used to control the process within the chamber.

In other embodiments of the invention, the first wavelength may be chosen which also varies highly in intensity depending on a second parameter, and the second wavelength may be chosen which is also relatively stable in intensity over time irrespective of variations of the second parameter, both by observing a statistically significant sample representing variations of the second parameter, and the numeric value is also correlated to the second parameter. The invention embodiment may include comparing the numeric value to a predetermined threshold value to generate an alarm signal for indicating when the particular parameter is out of specification, and using the numeric value to determine a physical value of the second parameter and to monitor variations of the second parameter. The second parameter may comprise an etch rate within the chamber.

In still other embodiments of the invention, the first wavelength and the second wavelength may be determined by processing a statistically significant sample of wafers representing variations of the particular parameter and measuring OES data for each wafer, periodically performing physical measurements of the particular parameter, and statistically correlating the OES data with the physical measurements to determine both the first wavelength present in the plasma which varies highly in intensity depending on the particular parameter, and the second wavelength of chemical significance to the process which is relatively stable in intensity over time irrespective of variations of the particular parameter.

While the invention has been described with respect to the embodiments set forth above, the invention is not necessarily limited to these embodiments. Accordingly, other embodiments, variations, and improvements not described herein are not necessarily excluded from the scope of the invention, which is defined by the following claims.

What is claimed is:

1. In a semiconductor process which utilizes a plasma within a process tool chamber, a method of using optical emission spectroscopy (OES) to determine whether etch stop conditions are present within the chamber, the method comprising:

first determining a first wavelength present in the plasma which varies highly in intensity depending on whether etch stop conditions are present within the chamber, and also determining a second wavelength of chemical significance to the etching process which is relatively stable in intensity over time irrespective of whether etch stop conditions are present within the chamber, determining both wavelengths by observing a statistically significant sample representing variations of the etching process, wherein the first and the second wavelength are determined by;

first running a statistically significant sample of wafers representing variations of the etching process without etch stop conditions present within the chamber, and measuring OES data for each wafer;

periodically performing physical measurements of etching parameters; then running a second sample of wafers while intentionally inducing etch stop conditions within the chamber, and measuring OES data for each wafer of this second sample; and statistically correlating the OES data against the physical measurement to determine both the first wavelength present in the plasma which varies highly in intensity depending on whether etch stop conditions are present within the chamber, and to determine the second wavelength of chemical significance to the process which is relatively stable in intensity over time irrespective of whether etch stop conditions are present within the chamber; then measuring the intensity of the first and second wavelengths present in the plasma on-line during normal processing within the process tool chamber; and ratioing the first and second wavelength's respective intensities to generate a numeric value which is correlated to the presence of etch stop conditions within the chamber.

2. A method as recited in claim 1 wherein the semiconductor process comprises a plasma-assisted etching process.

3. A method as recited in claim 2 wherein the plasma-assisted etching process comprises an oxide etching process.

4. A method as recited in claim 1 wherein the numeric value correlated to the etch stop process is used to generate an alarm signal for indicating when the etch stop process is out of specification.

5. A method as recited in claim 1 wherein the numeric value correlated to the etch stop process is used to determine a physical value of the etch stop process within a range of values.

6. A method as recited in claim 5 wherein the physical value of the etch stop process is used to control the process within the chamber.

7. A method as recited in claim 1 further comprising comparing the numeric value to a predetermined threshold value to generate an alarm signal for indicating when the etch stop process is out of specification.

8. A method as recited in claim 1 wherein:

the first wavelength is chosen which also varies highly in intensity depending on a second parameter, and the second wavelength is chosen which is also relatively stable in intensity over time irrespective of variations of the second parameter, both by observing a statistically significant sample representing variations of the second parameter; and the numeric value is also correlated to the second parameter.

9. A method as recited in claim 8 further comprising:

comparing the numeric value to a predetermined threshold value to generate an alarm signal for indicating when the etch stop process is out of specification; and using the numeric value to determine a physical value of the second parameter and to monitor variations of the second parameter.

10. A method as recited in claim 9 wherein the second parameter comprises an etch rate within the chamber.

11. A method as recited in claim 3 wherein the first wavelength is chosen to be approximately 517.6 nm, and the second wavelength is chosen to be approximately 581.2 nm.

12. A method as recited in claim 3 wherein the first wavelength is chosen to be approximately 440.8 nm, and the second wavelength is chosen to be approximately 581.2 nm.

* * * * *